(12) United States Patent
Goergen et al.

(10) Patent No.: US 8,158,892 B2
(45) Date of Patent: Apr. 17, 2012

(54) HIGH-SPEED ROUTER WITH BACKPLANE USING MULI-DIAMETER DRILLED THRU-HOLES AND VIAS

(75) Inventors: Joel Goergen, Maple Grove, MN (US); Greg Hunt, San Jose, CA (US)

(73) Assignee: Force10 Networks, Inc., San Jose, CA (US)

( * ) Notice: Subject to any disclaimer, the term of this patent is extended or adjusted under 35 U.S.C. 154(b) by 1282 days.

(21) Appl. No.: 11/891,785

(22) Filed: Aug. 13, 2007

(65) Prior Publication Data

US 2009/0045889 A1 Feb. 19, 2009

(51) Int. Cl.
*H05K 1/11* (2006.01)
(52) U.S. Cl. .......................... 174/266; 174/250; 174/261
(58) Field of Classification Search .................. 333/175, 333/176; 174/260–266, 256, 255, 250; 29/825–852; 361/788, 792–795
See application file for complete search history.

(56) References Cited

U.S. PATENT DOCUMENTS

| | | | | |
|---|---|---|---|---|
| 6,392,160 B1 * | 5/2002 | Andry et al. ................. | 174/261 |
| 6,541,712 B1 * | 4/2003 | Gately et al. ................. | 174/266 |
| 6,995,322 B2 * | 2/2006 | Chan et al. ................... | 174/262 |
| 7,047,628 B2 * | 5/2006 | Lee ................................ | 29/830 |
| 7,249,337 B2 * | 7/2007 | Gisin et al. ................... | 716/115 |
| 7,326,856 B2 * | 2/2008 | Takada ......................... | 174/250 |
| 7,337,537 B1 * | 3/2008 | Smetana, Jr. ................. | 29/852 |
| 7,505,285 B2 * | 3/2009 | Osaka .......................... | 361/788 |
| 7,852,635 B1 * | 12/2010 | Busletta et al. .............. | 361/784 |
| 2004/0108137 A1 * | 6/2004 | Vetter et al. .................. | 174/262 |
| 2004/0118605 A1 * | 6/2004 | van der Laan ............... | 174/262 |
| 2006/0203457 A1 * | 9/2006 | Busletta et al. .............. | 361/761 |
| 2008/0217052 A1 * | 9/2008 | Matsui ......................... | 174/266 |

* cited by examiner

*Primary Examiner* — Angel R Estrada
*Assistant Examiner* — Dimary Lopez
(74) *Attorney, Agent, or Firm* — Haynes and Boone, LLP

(57) ABSTRACT

A high-speed router backplane is disclosed. The router backplane uses differential signal pairs on multiple signal layers, each sandwiched between a pair of digital ground layers. Thru-holes are used to connect the differential signal pairs to external components. To reduce routing complexity, at least some of the differential signal pairs route through a via pair, somewhere along their path, to a different signal layer. At least some of the thru-holes and vias are drilled to reduce an electrically conductive stub length portion of the hole. The drilled portion of a hole includes a transition from a first profile to a second profile to reduce radio frequency reflections from the end of the drilled hole.

31 Claims, 16 Drawing Sheets

| Conductive Layers | | | | Insulating Layers | |
|---|---|---|---|---|---|
| Layer No. | Thickness | Type | | Type | Thickness |
| L01 { | 1.7 | Foil/Plating | | Mask | 0.7 |
|  | 1.3 | Pads | | B-stage | 5.8 |
| L02 | 1.3 | GND | | Core | 6.8 |
| L03 | 1.3 | HS1 | | B-stage | 6.8 |
| L04 | 1.3 | GND | | Core | 6.8 |
| L05 | 1.3 | HS2 | | B-stage | 6.8 |
| L06 | 1.3 | GND | | Core | 6.8 |
| L07 | 1.3 | HS3 | | B-stage | 6.8 |
| L08 | 1.3 | GND | | Core | 6.8 |
| L09 | 1.3 | HS4 | | B-stage | 6.8 |
| L10 | 1.3 | GND | | Core | 6.8 |
| L11 | 1.3 | GND | | B-stage | 10.0 |
| L12 | 5.5 | A 48V rtn | | Core | 6.8 |
| L13 | 5.5 | A 48V dc | | B-stage | 13.0 |
| L14 | 5.5 | B 48V dc | | Core | 6.8 |
| L15 | 5.5 | B 48V rtn | | B-stage | 10.0 |
| L16 | 1.3 | GND | | Core | 6.8 |
| L17 | 1.3 | GND | | B-stage | 6.8 |
| L18 | 1.3 | HS5 | | Core | 6.8 |
| L19 | 1.3 | GND | | B-stage | 6.8 |
| L20 | 1.3 | HS6 | | Core | 6.8 |
| L21 | 1.3 | GND | | B-stage | 6.8 |
| L22 | 1.3 | HS7 | | Core | 6.8 |
| L23 | 1.3 | GND | | B-stage | 6.8 |
| L24 | 1.3 | HS8 | | Core | 6.8 |
| L25 | 1.3 | GND | | B-stage | 5.8 |
| L26 { | 1.3 | Pads | | Mask | 0.7 |
|  | 1.7 | Foil/Plating | |  |  |

Fig. 4

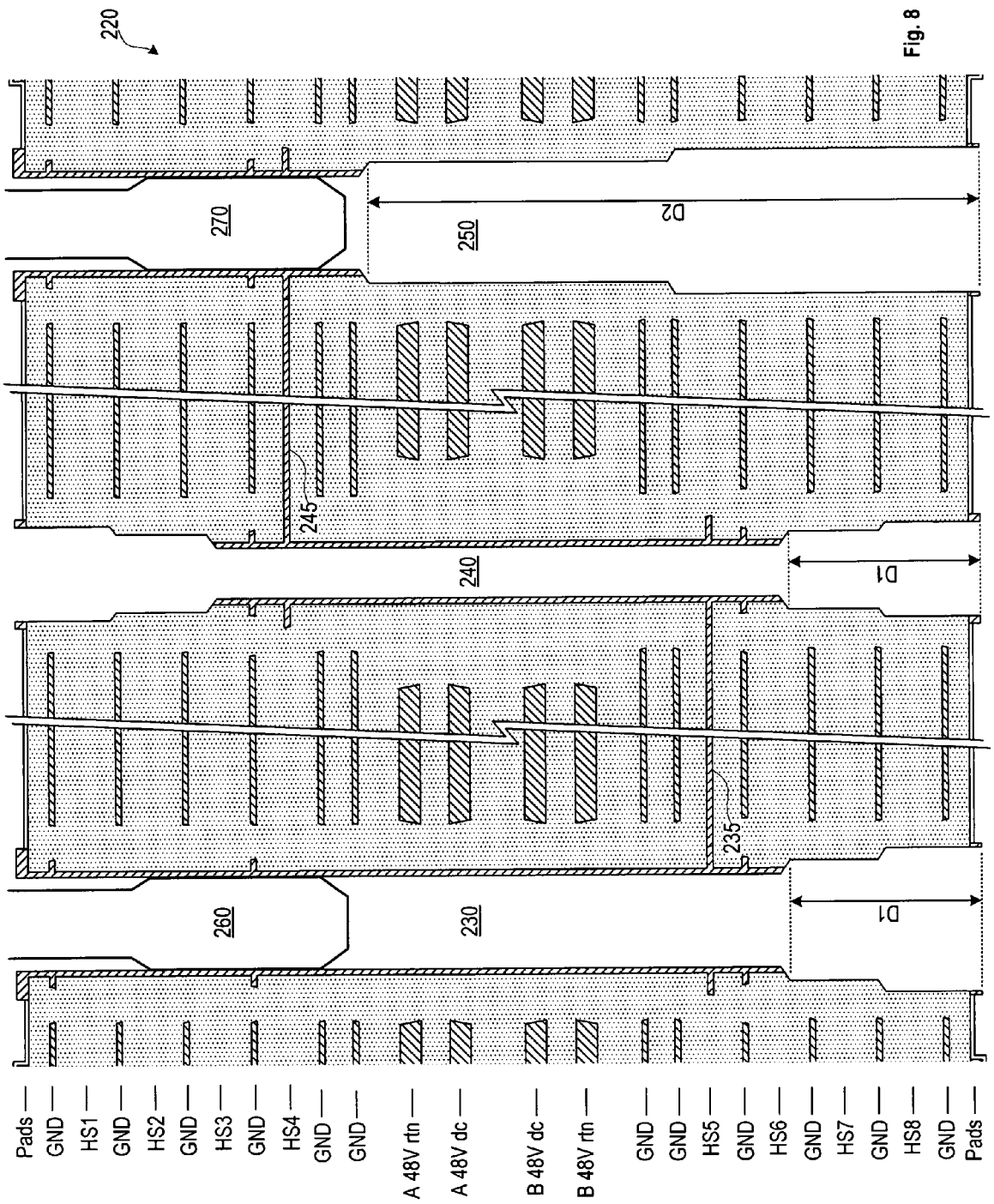

US 8,158,892 B2

HIGH-SPEED ROUTER WITH BACKPLANE USING MULI-DIAMETER DRILLED THRU-HOLES AND VIAS

FIELD OF THE INVENTION

This invention relates generally to backplanes, and more specifically to backplane wiring systems for high-speed digital communications systems such as packet routers and switches.

BACKGROUND OF THE INVENTION

A backplane generally comprises a printed circuit board having a number of card connection slots or bays. Each slot or bay comprises, e.g., one or more modular signal connectors or card edge connectors, mounted on the backplane. A removable circuit board or "card" can be plugged into the connector (s) of each slot. Each removable circuit board contains drivers and receivers necessary for communication of signals across the backplane with corresponding drivers and receivers on other removable circuit boards.

One or more layers of conductive traces are formed on and/or in the backplane. The traces connect to individual signal connection points at the various slots to form data lines and control lines.

In U.S. Pat. No. 6,812,803, entitled "Passive Transmission Line Equalization Using Circuit Board Through-Holes," issued Nov. 2, 2004, and incorporated herein by reference, an inventor of the present application describes a high-speed router backplane design. This design is applicable to extremely high signaling speeds, large panel sizes, and high overall throughputs. In U.S. patent application Ser. No. 10/454,735, entitled "High-Speed Router with Backplane Using Tuned-Impedance Thru-Holes and Vias," filed Jun. 3, 2003, and incorporated herein by reference, an inventor of the present application describes related technology for tuned-impedance vias. And in U.S. patent application Ser. No. 11/009,408, entitled "Backplane with Power Plane Having a Digital Ground Structure in Signal Regions," filed Dec. 8, 2004, and incorporated herein by reference, an inventor of the present application describes related technology for further improvements in such backplane design.

BRIEF DESCRIPTION OF THE DRAWING

The invention may be best understood by reading the disclosure with reference to the drawing, wherein:

FIG. 4 shows the complete material stack in cross-section for the router backplane shown in FIG. 3 according to an embodiment;

FIGS. 8, 9, and 10 show cross-sections of a layer-swapped signal line between two signal thru-holes according to several embodiments.

DETAILED DESCRIPTION OF THE PREFERRED EMBODIMENTS

Figure 1:
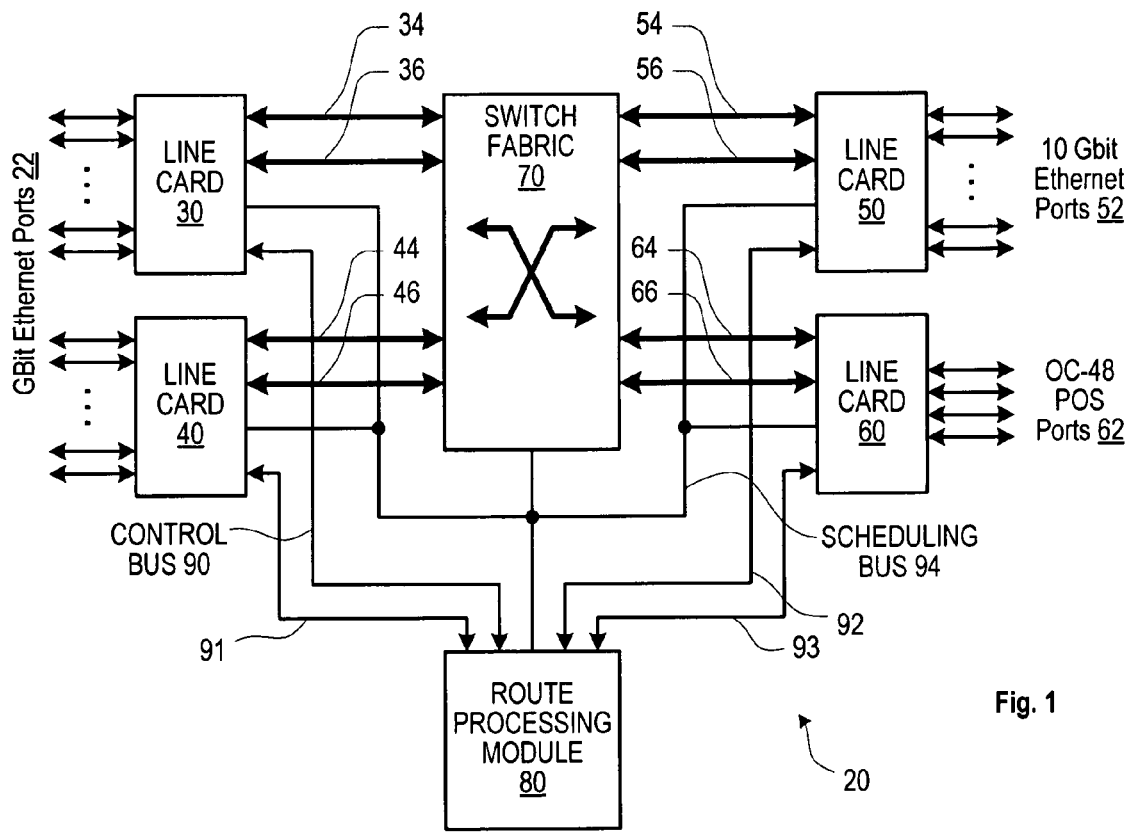
FIG. 1 contains a block diagram of a high-speed router/switch.

Several terms have been assigned particular meanings within the context of this disclosure. As used herein, high speed signaling refers to signaling on a differential signal pair at a data rate greater than about 2.5 Gbps. A high-speed signaling layer or high-speed differential trace plane contains high-speed differential signal trace pairs, but may also contain lower speed and/or single-ended traces. A core dielectric layer is one that is cured and plated prior to assembly of a circuit board. A b-stage dielectric layer is one that is cured during assembly of cores into the circuit board. Differential signaling (or balanced signaling) is a mode of signal transmission, using two conductors, in which each conductor carries a signal of equal magnitude, but opposite polarity. Single-ended signaling (or unbalanced signaling) is a mode of signal transmission where one conductor carries a signal with respect to a common ground. The impedance of a differential trace is more differential than single-ended if the impedance between that trace and its differentially paired trace is less than the impedance between that trace and ground. A signaling thru-hole or through-hole couples a signal exterior to a circuit board to a conductor internal to the circuit board. A via couples a signal between two internal circuit board conductors on different trace routing layers.

The preferred embodiments described in the '803 patent incorporate a number of unconventional design features, such as a high layer count (and large overall thickness), thick power planes, and an exotic dielectric material. While these backplanes are capable of throughputs measurable in Terabits/second and high-wattage, low-noise power distribution, some of the features used to obtain this extreme performance tend to drive up cost and layer count. Furthermore, transceiver (serializer/deserializer or serdes) technology continues to advance, such that even higher-speed, lower-loss, and lower-noise backplane solutions are or may soon be required.

In present embodiments, layer counts are reduced by the use of layer-swapping vias. It has now been found that the incorporation of such vias in high-speed differential signaling paths can be accomplished without unacceptably degrading the differential channel, even with increased channel bit rates, due to a further improvement in via and/or thru-hole design. It has also now been found that this improvement can significantly reduce crosstalk and radio frequency (RF) noise emanating from the vias and thru-holes.

In at least some embodiments, the improvement includes a selective backdrill process and/or frontdrill process. Backdrill processes incorporating a constant diameter drill step that removes a stub portion of the conductive liner from a thru-hole are known. It has now been found that significant improvements in signal reflection attenuation, cross-talk attenuation, and EMI (electromagnetic interference) attenuation are possible using, e.g., a stepped backdrill profile. For instance, a stub portion of a conductive liner can be removed using two drill cycles with different drill depths and diameters, or using a specialized drill bit that creates such a backdrill profile in one drill cycle. Details for these and other embodiments are described below in conjunction with specific embodiments.

Overall Router Overview

A short description to one backplane and router design useful with the embodiments will now be used as a preface to the embodiments. FIG. 1 shows a high-level block diagram for a router 20. Line cards 30, 40, 50, and 60 provide physical ports to the device. For instance, line cards 30 and 40 can each provide up to 90 Gigabit Ethernet ports 22 into router 20. Line card 50 provides up to 16 10-Gigabit Ethernet ports 52, and line card 60 provides up to four OC-48 POS (Packet-Over-Sonet) ports 62. Although four line cards are shown, many backplanes provide slots to accommodate many more cards, e.g., up to fourteen line cards in one embodiment (illustrated in FIG. 3) and up to seven line cards in another embodiment. The user can configure device 20 to accommodate different traffic capacities, traffic models, and physical port mixes by the appropriate selection of numbers and types of line cards.

Switching fabric 70 switches each routed data packet from that packet's ingress port/line card to that packet's egress port/line card. Switching fabric 70 connects to each line card through two full duplex switching fabric port connections (see, e.g., port connections 44, 46 to line card 40). Switching fabric 70 can be reconfigured rapidly on an epoch-by-epoch basis (an epoch is a defined time slice). For instance, at one epoch, fabric 70 may be switching packets from ingress port 44 to egress port 54 and from ingress port 46 to egress port 66, and at the next epoch, fabric 70 could be switching packets from ingress port 44 to egress port 64. At any given epoch, ingress ports and egress ports are paired to utilize as many switching ports as possible without unduly delaying a particular set of packets.

Figure 3:
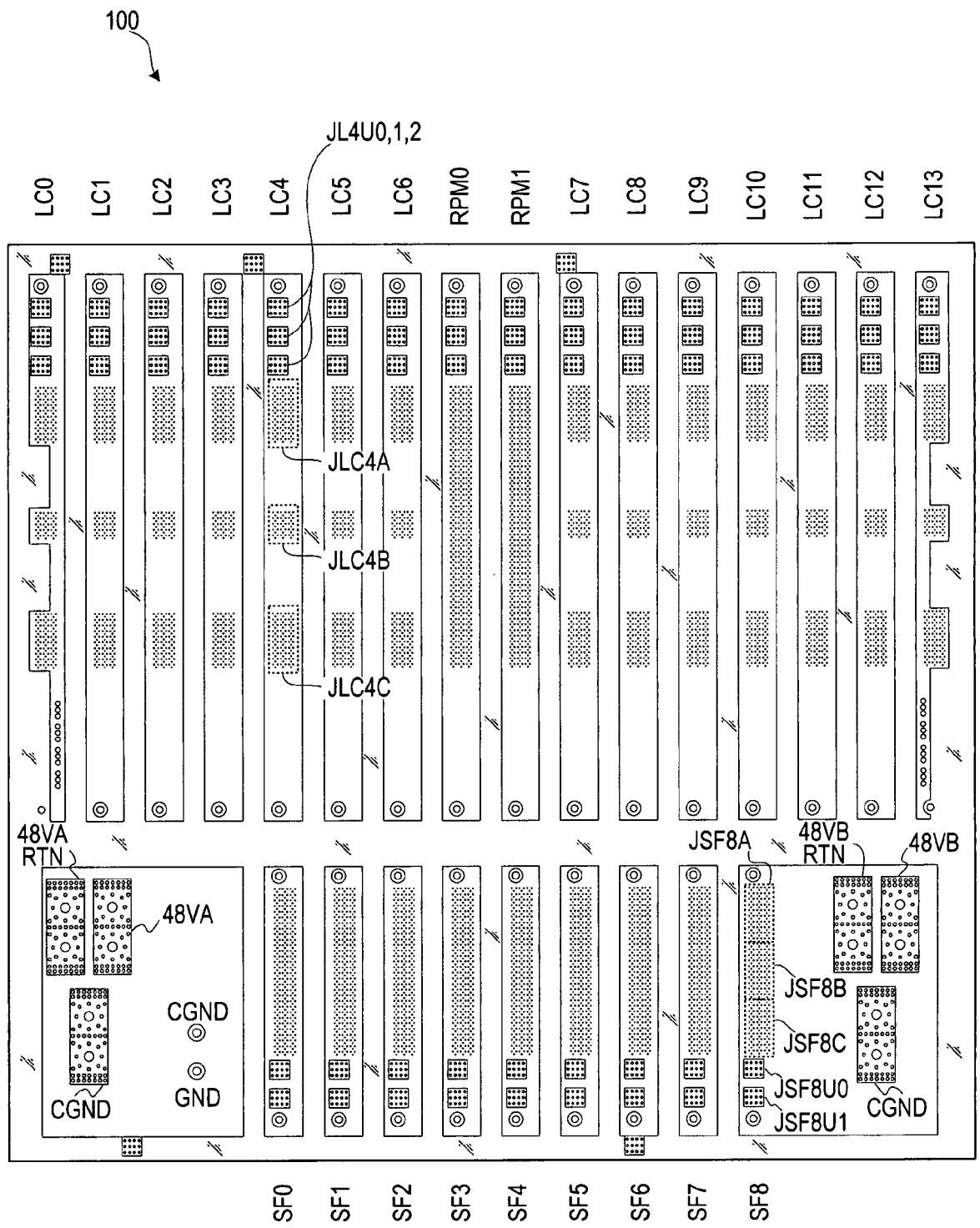
FIG. 3 shows the external layout for a router backplane circuit board according to an embodiment.

In the backplane layout of FIG. 3, the switching fabric functionality is distributed among nine identical switch fabric cards that connect to slots SF0 to SF8. Eight switch fabric cards are ganged to actively switch packet data in parallel (the ninth provides redundancy). In this configuration, a full-duplex switching fabric "port" actually comprises 18 differential pairs connected to a line card—one transmit pair from the line card to each switch fabric card, and one receive pair from each switch fabric card to the line card. The differential pairs are each dedicated to unidirectional data transmission between a particular line card serdes at one end and switch fabric serdes at the other end, such that in normal operation all differential channels remain fully active and ready to transmit data as soon as each epoch begins.

Route processing module (RPM) 80 resides on an RPM card. RPM 80 has several duties. RPM 80 is responsible for overall system operation, i.e., recognizing and booting new line cards, identifying faulty line cards, packet route discovery, and sharing routing table information with the line cards. RPM 80 also provides a user interface (not shown) to allow a system operator to configure the system and view system parameters. RPM 80 can also receive and transmit packets external to the router using any of the line card physical ports. For each of these functions, RPM 80 generally communicates with one of the line cards over a control bus (buses 90, 91, 92, and 93 respectively for line cards 30, 40, 50, and 60). As compared to the switching fabric ports, the control buses can incorporate a relatively low-speed channel. In the backplane design of FIG. 3, provision is also made for a second RPM card connected to router 20 to provide failover capability.

Another duty of RPM 80 is scheduling switching fabric 70. In a preferred implementation, RPM 80 reconfigures switching fabric 70 every epoch. RPM 80 uses scheduling bus 94 to communicate to switching fabric 70—as well as to line cards 30, 40, 50, 60—the switching fabric configuration for the upcoming epochs. RPM 80 attempts to schedule as many fabric ports as possible during each epoch, and to ensure that data is handled promptly and fairly. As compared to the switching fabric ports, the scheduling bus can be a relatively low-speed channel.

Figure 2:
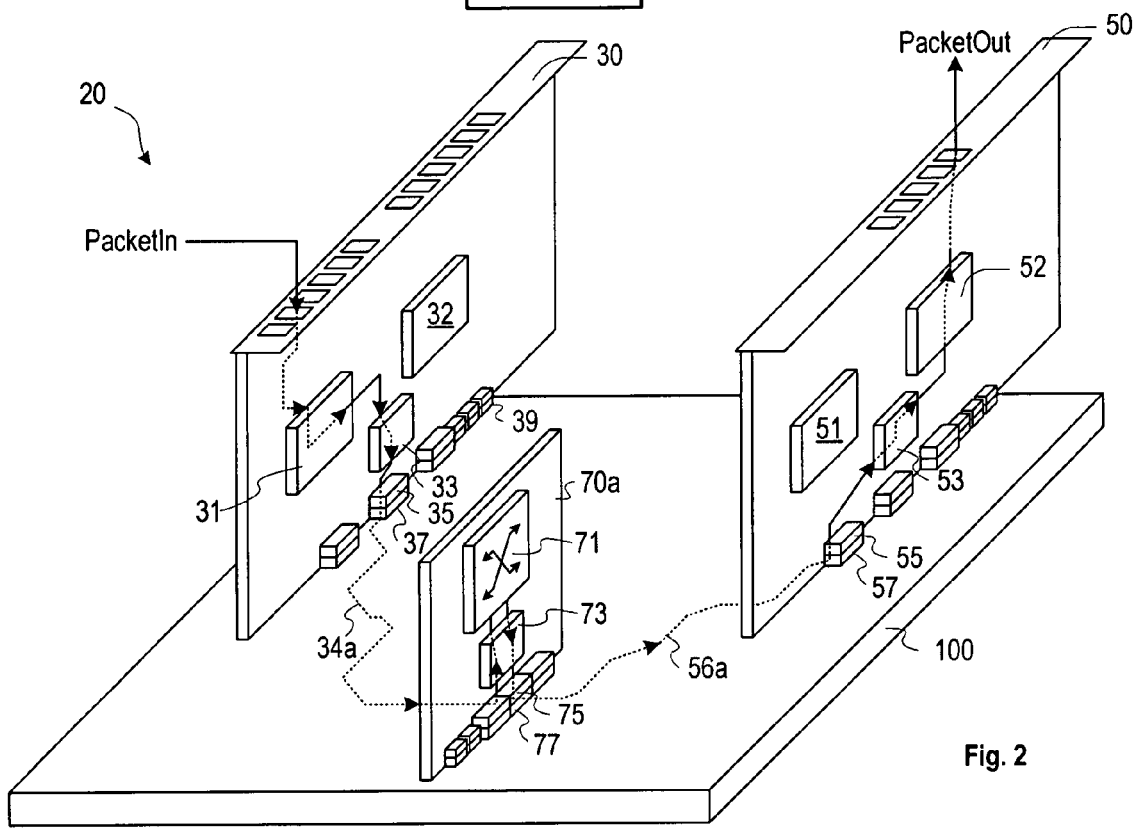
FIG. 2 illustrates one possible path for traffic entering a router/switch at one line card and exiting the router at another line card.

FIG. 2 shows an exemplary data path taken by a packet as it traverses router 20 (the packet is split among multiple routes on part of its journey—only one of these multiple routes is shown). FIG. 2 depicts three cards that would be inserted in a typical system—an ingress line card 30, an egress line card 50, and a switch fabric card 70a. Note that a fully functional system would usually contain at least seven additional switch fabric cards and at least one functioning RPM card, but these have been omitted from FIG. 2 for clarity.

Cards 30, 50, and 70a are shown connected to a backplane 100 using board connectors and sockets, of which the numbered connectors 35, 55, 75 and numbered sockets 37, 57, 77 are typical. The board connectors are press-fit onto their respective cards, and the matching sockets are press-fit onto the backplane. A card then can be connected to the backplane by mating the connectors with the sockets at a desired card slot. Other connectors (such as connector 39) located at each slot perform functions such as supplying power to a card.

The number of integrated circuits and division of circuitry functions on a card can be varied in many ways. In FIG. 2, line card circuitry is illustrated in one possible configuration: an ingress circuit (31 and 51) for processing packets received at the line card, an egress circuit (32 and 52) for processing packets to be transmitted by the line card, and a serdes (serializer/deserializers 33 and 53) for passing packets between the ingress/egress circuits and the switch fabric cards. Switch fabric card circuitry is illustrated in one possible configuration also: a switch 71 in communication with a serdes 73 to pass packet data between switch 71 and the line cards.

One possible data path through router 20 is shown in FIG. 2. An incoming packet PacketIn is received at a port on line card 30. Ingress circuit 31 processes the packet, determines that the appropriate router egress port is on line card 50, and queues the packet in a queue corresponding to line card 50. At an appropriate epoch, one data path of switch 71 is configured (along with the corresponding switches on the other switch fabric cards, not shown) to switch data from line card 30 to line card 50. During that epoch, serdes 33 receives the exemplary packet's data from the queue, divides it among eight lanes, serializes it, and transmits a lane of that data to each of eight switch fabric cards. Serdes 33 transmits the lane of that data bound for switching fabric card 70a over a physical path comprising connector 35, socket 37, differential pair 34a in backplane 100, socket 77, and connector 75. Serdes 73 receives that data, de-serializes it, and passes it to switch 71. Switch 71 switches the data to an appropriate channel for line card 50, and then passes the data back to serdes 73. Serdes 73 reserializes and transmits the data over a physical path comprising connector 75, socket 77, differential pair 56a in backplane 100, socket 55, and connector 57. Serdes 53 combines the serial data received over eight lanes from the switch fabric cards and passes the de-serialized data to egress circuit 52. Egress circuit 52 performs additional packet processing, and queues the packet for transmission out the appropriate egress port as PacketOut.

Backplane Layout

FIG. 3 shows a detailed backplane-plating layout for a router 20 and backplane 100 as described in FIGS. 1 and 2. A top panel region of backplane 100 has connector regions ("slots") for sixteen cards. The outboard seven slots on each end are each configured to accept a line card (slots LC0 to LC6 and LC7 to LC13). The middlemost two slots are each configured to accept a route-processing module (slots RPM0 and RPM1). Each slot has three upper connector regions (e.g., regions JL4U0, JL4U1, and JL4U2 for slot LC4) used to distribute power and ground signals to a card. Below these, each line card slot has three high-speed connector regions (e.g., regions JLC4A, JLC4B, and JLC4C for slot LC4). The RPM slots serve more card connections than the line card slots, and therefore use a larger high-speed connector region. In one embodiment, the high-speed connector regions are laid out to accept Z-PACK™ HS3 press-fit sockets, available from Tyco Electronics Corporation (formerly AMP Incorporated).

A bottom panel region of backplane 100 contains connector regions or slots for nine cards. Each of these slots in configured to accept a switch fabric card (slots SF0 to SF8). Each slot has two lower connector regions (e.g., regions JSF8U0 and JSF8U1 for slot SF8) used to distribute power and ground signals to a switch fabric card. Above these, each switch fabric card slot has three high-speed connector regions (e.g., regions JSF8A, JSF8B, and JSF8C for slot SF8).

The bottom panel region also contains connector regions for connecting power and ground to the backplane. Two 48-volt power distribution layers are embedded in backplane 100, an "A" power distribution layer and a "B" power distribution layer. At the lower left of backplane 100, two large multi-thru-hole regions 48VA and 48VA RTN allow for connection of "A" power supply and return leads to one power supply, and a third large region CGND allows for connection of a common ground. Similar connections for a "B" power distribution layer to a second power supply exist at the lower right of backplane 100.

With reference now to FIG. 4, the material "stack" 120 used to create backplane 100 in one embodiment is illustrated in cross-section. The material stack 120 has 26 conductive layers L01 to L26 separated by appropriate insulating layers. For each conductive layer, FIG. 4 labels that layer with a layer thickness in mils and an identifier for the layer. Layers labeled "GND" are digital ground plane layers, constructed from 1 oz. copper. Layers labeled "HSn" are the high-speed signaling layers, where n represents the layer number, also constructed from 1 oz. copper. The two "A 48V" layers are the supply ("dc") and return ("rtn") for one power supply, and the two "B 48V" layers are the supply and return for the other power supply, and are all constructed from 4 oz. copper. For each insulating layer, the layer is accompanied by a description of whether the layer is a core or a b-stage layer, and the final thickness of the layer in mils.

To achieve high signaling speeds, the dielectric layers use a dielectric with significantly lower loss at multi-Gbps signaling rates than conventional FR-4 dielectric systems. Two such materials are FR406 and IS620, both available from the Isola Group. For the core layers, two layers of a glass style 2113 with 50.2% resin content are used. For the signaling b-stage layers, three layers are used, with glass styles 1080/106/1080 and resin contents 65%/75%/65% are used. For the b-stage layers abutting a power plane, a glass style 2113 with 57% resin content is used, with three glass layers between L11 and L12 and between L15 and L16, and with four glass layers between L13 and L14.

The arrangement of the conductive layers also enhances signaling speed and helps control EMI (electromagnetic interference). Each high-speed layer (with its differential signaling traces) is formed approximately equally spaced from and between two digital ground planes, e.g., high-speed layer HS1 is formed on layer L03, between ground planes at L02 and L04. The four power distribution layers L12 to L15 are isolated from the remaining stack by four digital grounds (L10, L11, L16, and L17) at the center of the material stack. Further, the two power supply planes are placed between the two power return planes to provide yet one more layer of isolation. The result is a material stack that provides clean power distribution and good isolation for the high-speed signals.

One additional observation is that in order to provide these capabilities, the complete material stack is relatively thick, approximately 236 mils including 26 conductive layers.

Thru-Hole and Via Fabrication

Figure 5A:
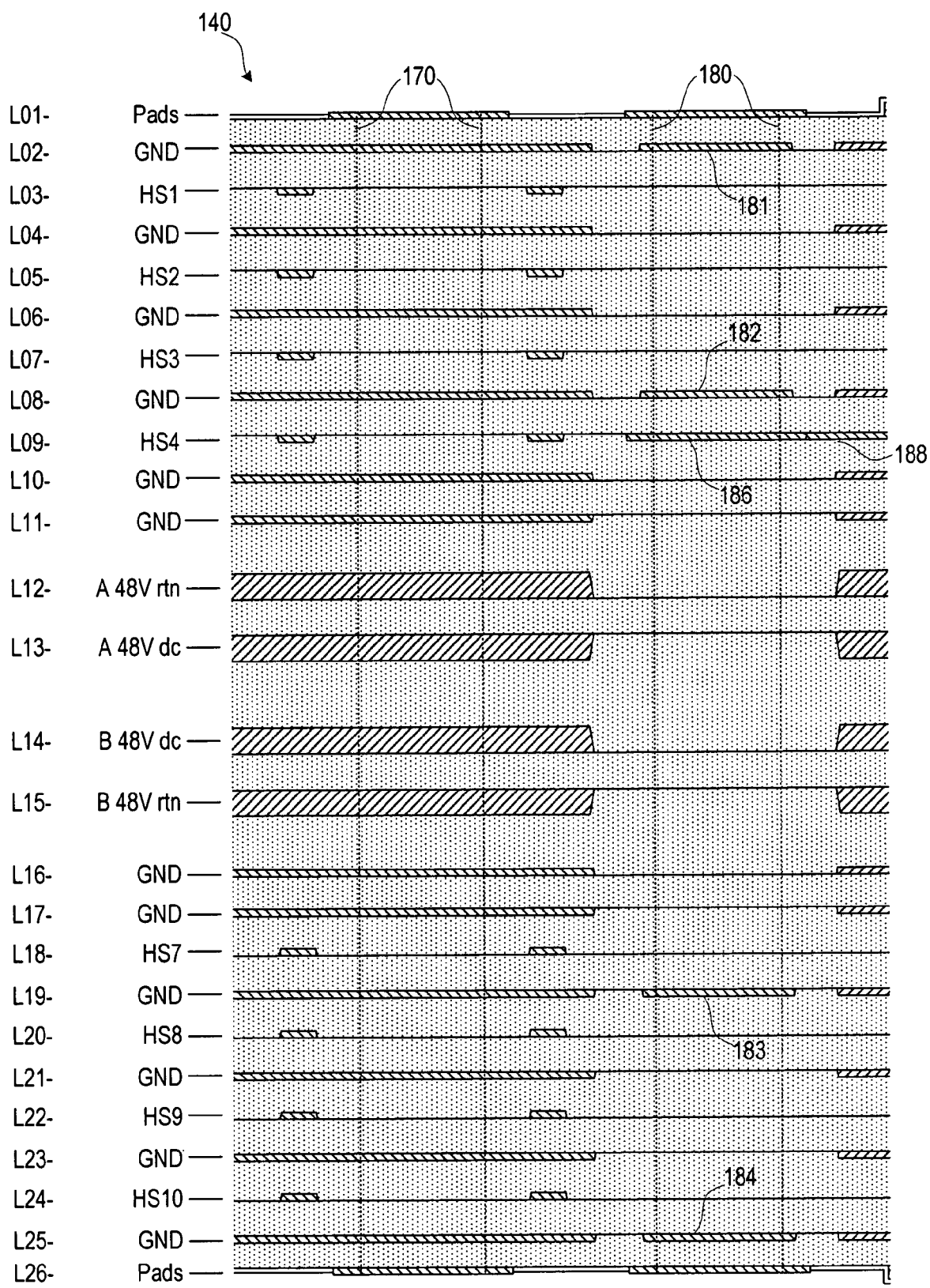
FIGS. 5A-E illustrate various steps in the fabrication of a signal thru-hole and a ground hole in cross-section for the router backplane shown in FIG. 3 according to an embodiment.

FIGS. 5A-5E illustrate, in cross-section, several fabrication steps in the constructions of a ground thru-hole 170 and a backplane signaling thru-hole 180 in an embodiment. Referring first to FIG. 5A, a cross-section 140 of the backplane containing the eventual locations of thru-holes 170 and 180 (shown in dotted lines) is shown prior to drilling. In addition to shielding and trace impedance control, the digital ground layers will be used for stub impedance control at the location of the signal thru-hole 180. In the '803 patent and '735 application, respectively, conductive pads are placed in the backplane on selected ground plane layers at the locations of high-speed signaling thru-holes and vias in order to reduce stub reflections on the line due to thru-hole/via stubs and thereby improve impedance characteristics for the differential pairs. Several ground plane layers (L02, L08, L19 and L25) are fitted with nonfunctional pads (181, 182, 183, and 184) at the desired location of signaling thru-hole 180. The pads are nonfunctional in the sense that they are not required to aid assembly, alignment, board integrity, or to complete a signal path, and are not used to connect thru-hole 180 to a trace or plane layer. These pads adjust the impedance of the stubs formed by the thru-holes, reducing reflections and thereby improving the quality of the signals passing through the backplane.

Another pad 186, connected to a signaling trace 188, is formed on high-speed signaling layer HS4 in this example at the desired location of signaling thru-hole 180. This pad will be used to couple a signal into the backplane.

Figure 5B:
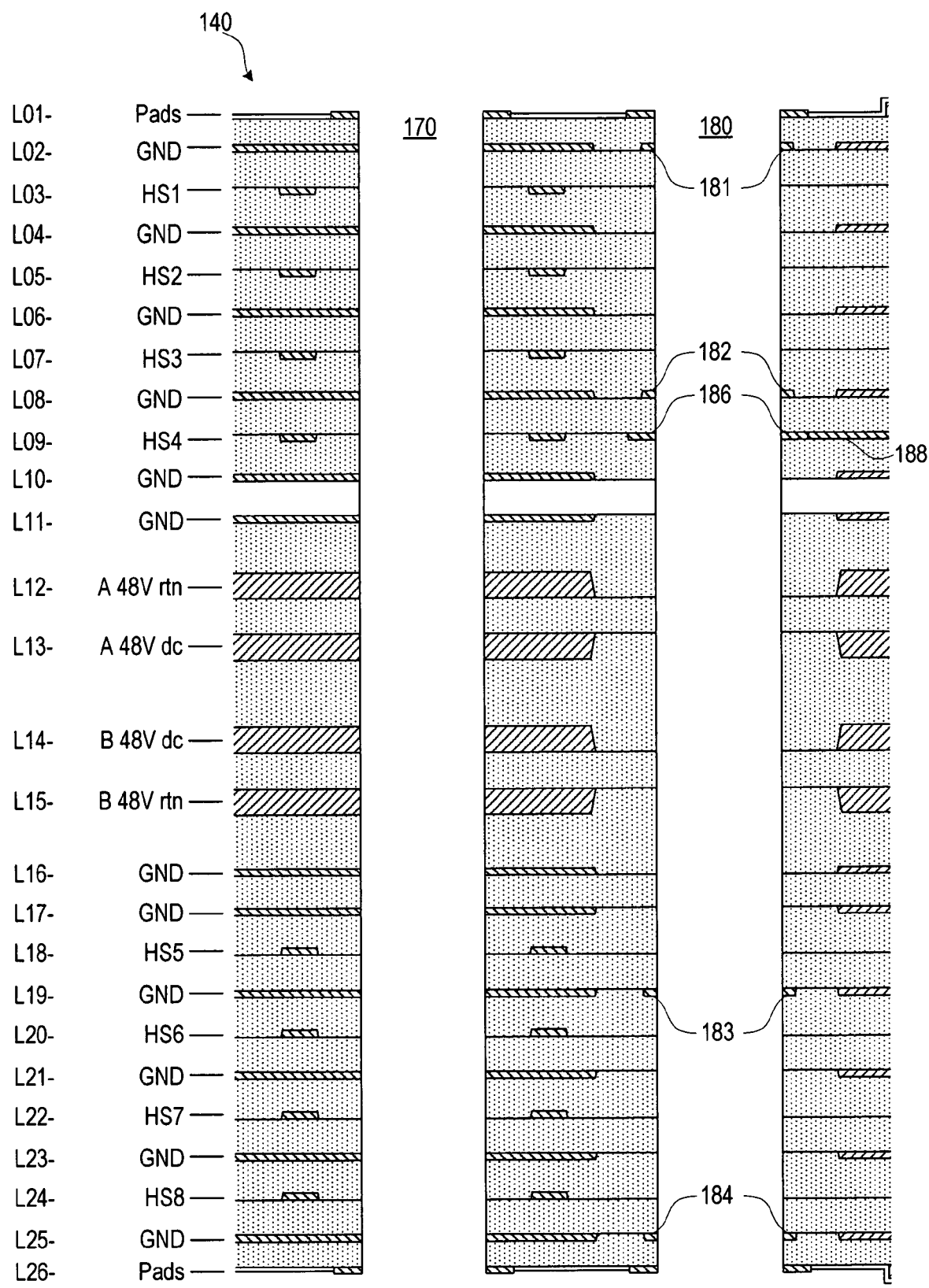

FIG. 5B shows cross-section 140 after drilling of the thru-holes 170 and 180. In one embodiment, the thru-holes are drilled with a 24-mil diameter. After drilling, pads 181, 182, 183, 184, and 186 are annular, with an inner edge coincident with the sidewalls of thru-hole 180. Thru-hole 170 is drilled through ground plane layers L02, L04, L06, L08, L10, L11, L16, L17, L19, L21, L23, and L25. Thru-hole 170 is also drilled through power supply layers L12, L13, L14, and L15, although this particular section of each power supply layer will be connected to the digital ground planes and not be connected to the portion of the layer supplying power, as detailed in the '408 application.

Figure 5C:
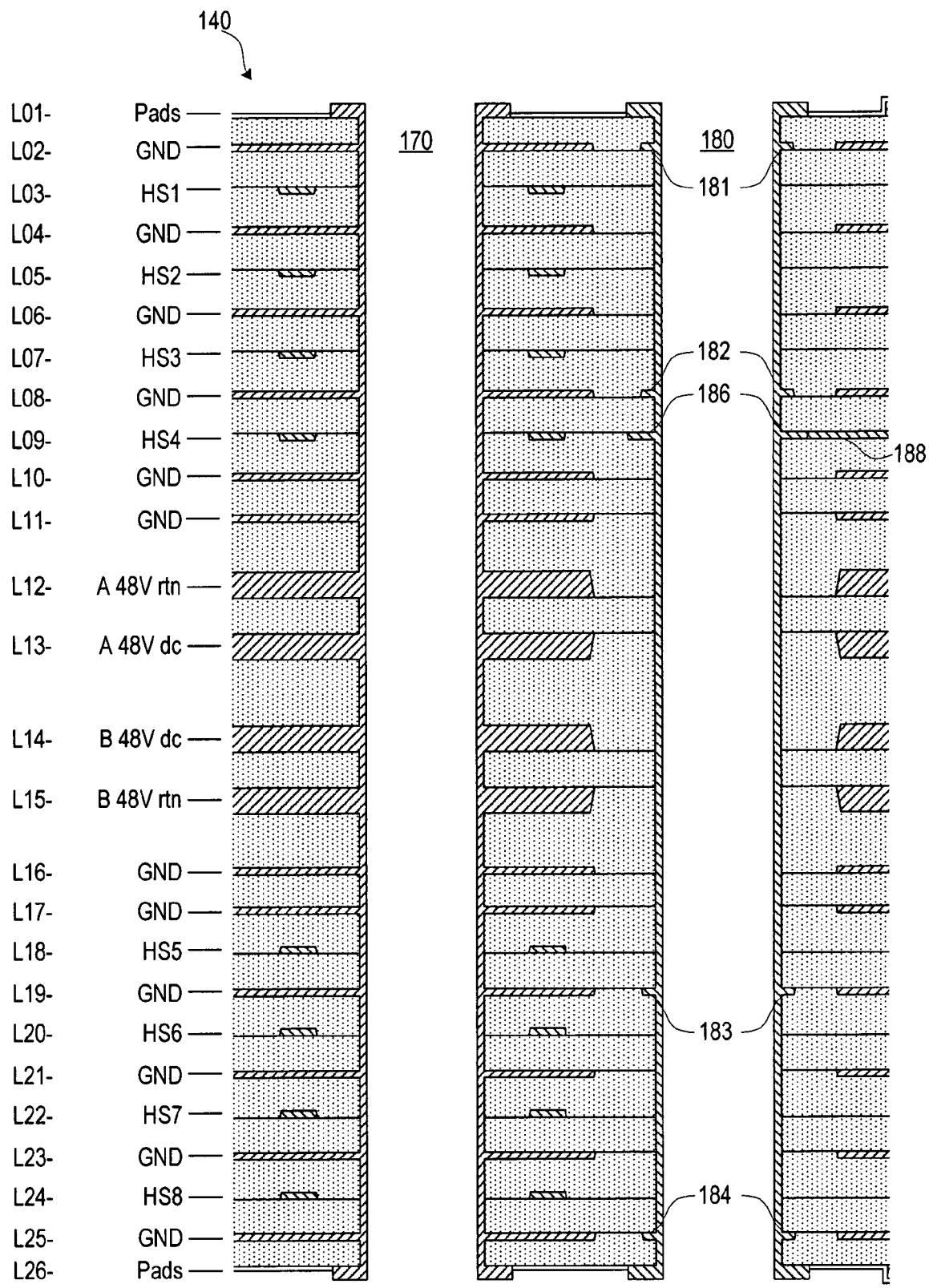

FIG. 5C shows cross-section 140 after copper plating of the thru-holes 170 and 180, e.g., to a plating thickness of about 1 to 1.5 mils. Thru-hole 170 now contains a conductive liner electrically coupled to ground plane layers L02, L04, L06, L08, L10, L11, L16, L17, L19, L21, L23, and L25 and power plane layers L12, L13, L14, and L15. Thru-hole 180 now contains a conductive liner electrically coupled to pads 181, 182, 183, 184, and 186.

It is known to reduce stub reflections by "back-drilling" the stub portion of a thru-hole. The back-drilling process uses a drill bit of sufficient diameter to remove the conductive plating from a stub portion of the thru-hole, thereby removing the conductive path forming the stub.

Figure 5D:
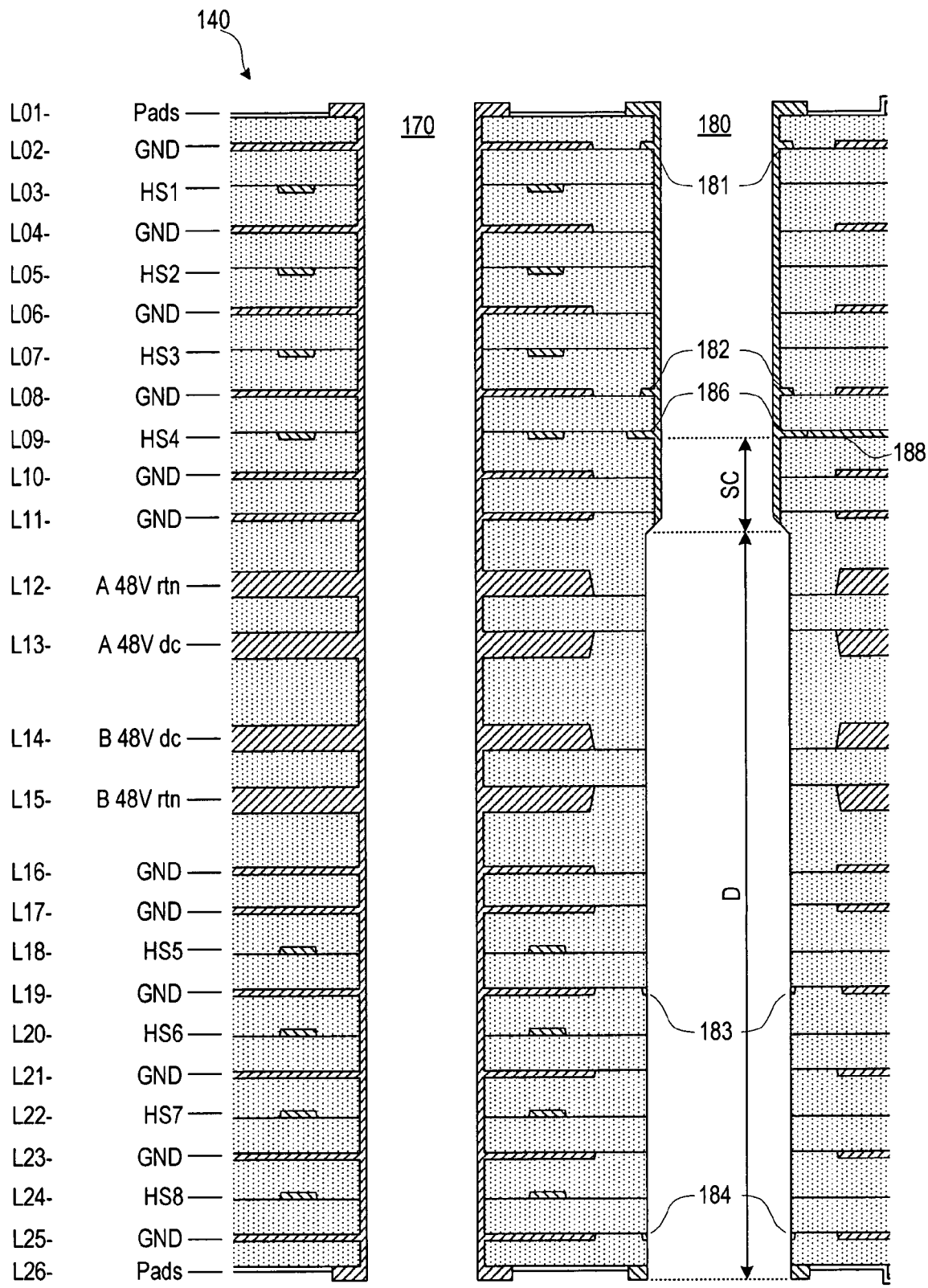

In FIG. 5D, such a process is used to remove the conductive liner from thru-hole 170 below layer L11, e.g., by drilling from the bottom side of cross-section 140 to a depth D, using a drill diameter of 28 to 29 mils. A drill stop clearance SC, e.g., approximately 20 mils from the signal pad on layer HS4, is specified to avoid severing the connection to trace 188 inadvertently by slightly over-drilling when drilling to drill depth D. This stop clearance results in a small 20 mil stub remaining below the trace.

Differential signaling speeds that are now being studied contain significant energy, it is believed for the first time, at frequencies with free-air wavelengths on the order of the backplane thickness. For instance, the FIG. 4 material stack 120 has a nominal thickness of 236 mils, roughly equivalent to the free-air wavelength of a radio-frequency (RF) signal at 8 GHz. When such a board is used for binary signaling at, e.g., 25 Gbps, frequencies up to roughly 13 GHz ($\lambda$=145 mils) can contain useful signaling information.

It is now believed that a thru-hole or via can act as a waveguide at such wavelengths, even though the thru-hole or via is back-drilled to reduce the electrical stub length. Signal reflections within the electrically conductive stub portion of the thru-hole itself may be greatly reduced by standard back-drilling, but RF energy may be launched down the back-drilled portion of the thru-hole (length D in FIG. 5D) and can still produce deleterious effects. Although some of this RF energy passes out of the board, a portion of this RF energy is reflected from the open end of the thru-hole, which is seen as a significant impedance mismatch by energy traveling down the waveguide. The impedance mismatch reflects RF energy back towards the conductive region of the thru-hole. The reflected RF energy can be re-coupled onto the signal path, or can propagate through the dielectric material laterally and couple as crosstalk onto other signal paths or couple onto the ground plane system.

It is recognized herein that at some useful channel frequencies, the length of the back-drilled hole D may be comparable to a half-wavelength or multiple thereof at those frequencies. It is now believed that this results in harmful standing wave reflections from the thru-hole end at or near these frequencies. These standing waves tend to be reintroduced, alternately constructively and destructively with changing wavelength, to the signal line and/or coupled into the backplane as crosstalk as frequency increases. The effect is believed to be observable as undesirable ripples in the channel frequency response curve. In one board characterization measurement, a ripple of roughly ±4 dB is superimposed on the average frequency response, it is believed due at least in part to thru-hole and via reflections. In this board prior to application of an embodiment as will be described below, undesirable channel attenuation ripples are observed, including several areas of excess signal loss centered roughly at 6 and 8 GHz. It has now been observed that these signal attenuation ripples correspond to back-drill depths D selected for the thru-holes and vias at particular layer depths. A 6 GHz signal has a free-air half-wavelength of approximately 156 mils, corresponding roughly to a back-drill (or top-drill in some cases) depth used for vias. An 8 GHz signal has a free-air half-wavelength of approximately 118 mils, corresponding roughly to a back-drill depth used for thru-holes.

Figure 5E:
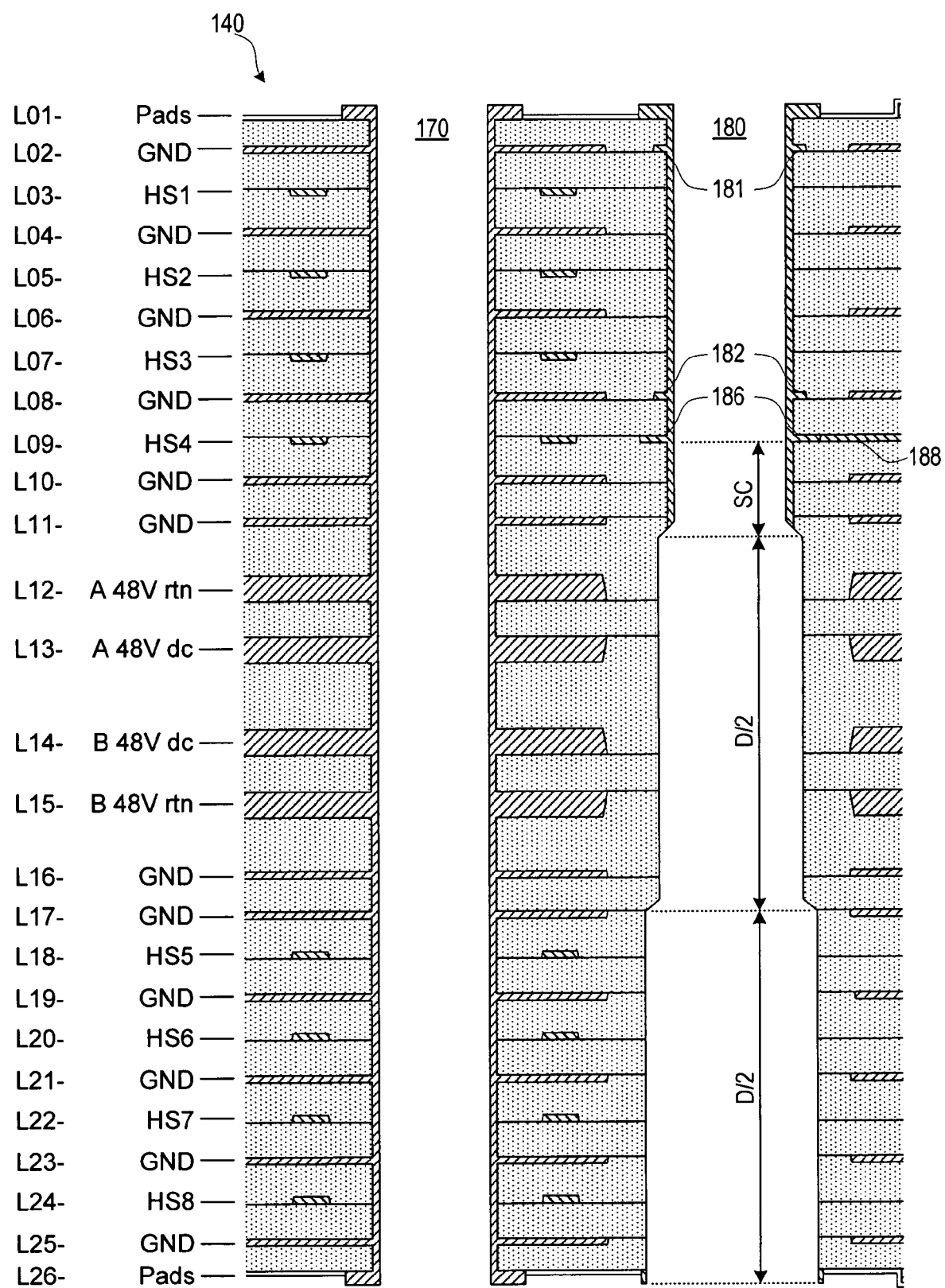

The present embodiment reduces the potential for RF reflection disturbances using a second back-drill cycle, as shown in FIG. 5E. The hole 180, which was back-drilled to a depth of D with a 28- to 29-mil drill diameter, is now back-drilled a second time, to a depth of D/2, with a drill diameter of 34 to 36 mils. It is believed that the discontinuity in the waveguide structure between the two hole profiles disrupts the resonant reflections that were present in the single-drilled thru-hole, resulting in decreased ripple in the channel frequency response and decreased crosstalk.

The difference in diameter between the two hole profiles controls the distribution of energy at the transition point, and can be adjusted as desired. A difference in diameter of 10 to 20 percent has been observed to produce good results in test cases, e.g., at least 5 dB improvement in electrical performance measured at 10 GHz.

The depth of the transition point can also be adjusted. In test cases, a transition point halfway along the back-drilled portion of the thru-hole has been observed to produce good results. It is now believed that an advantage of this transition depth is that, for energy with a wavelength twice that of the back-drill depth, energy at that wavelength reflected from the second back-drill transition point travels a half-wavelength back to the conductive portion of the thru-hole, and can thus cancel itself. Both halves of the back-drilled portion of the thru-hole have a reflection path of ¼ wavelength, and therefore can serve to cancel reflected energy at the resonant wavelength of the entire back-drilled section of the thru-hole.

Figure 6A:
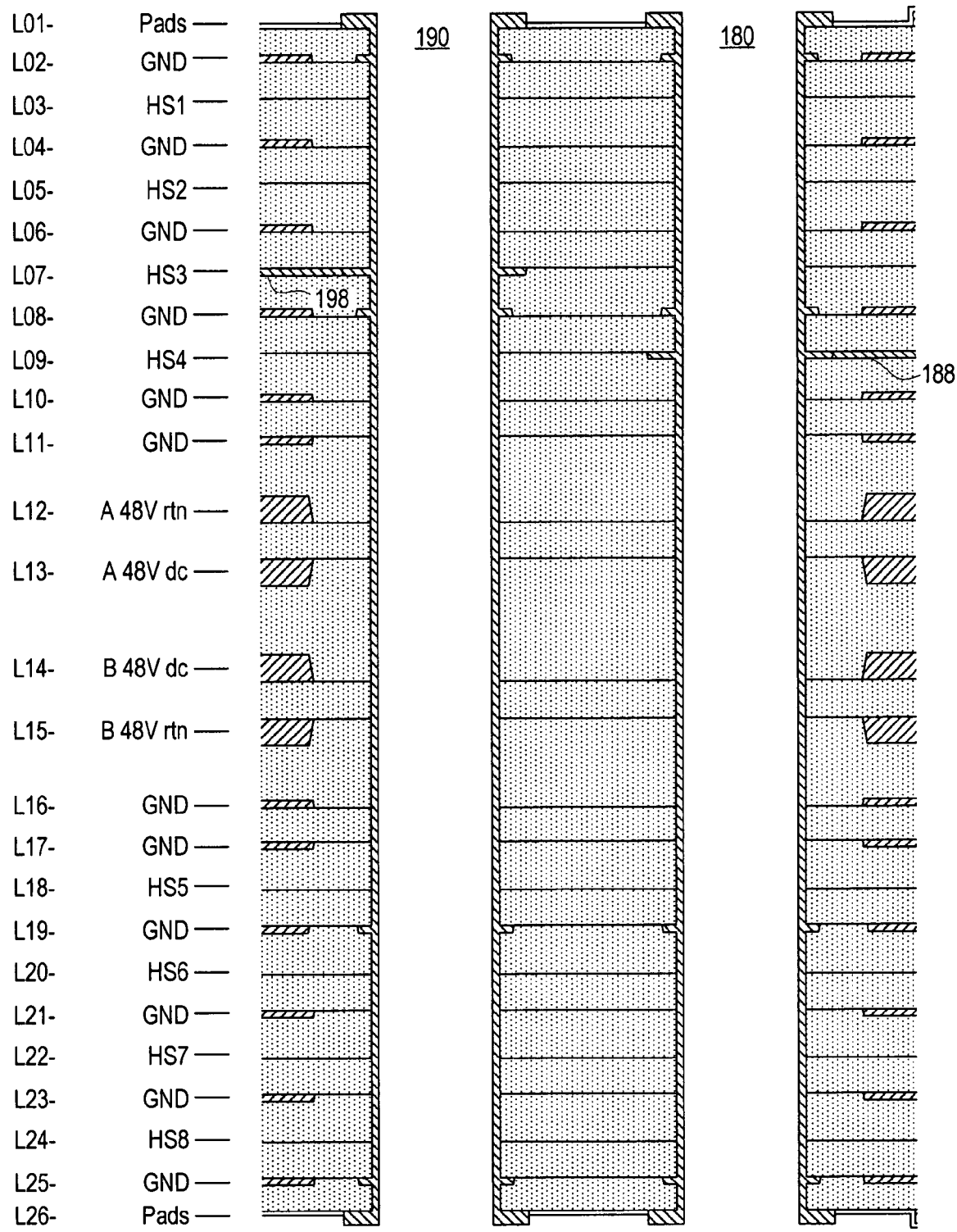
FIGS. 6A and 6B illustrate steps in the fabrication of two signal thru-holes in cross-section for the router backplane shown in FIG. 3 according to an embodiment.
Figure 6B:
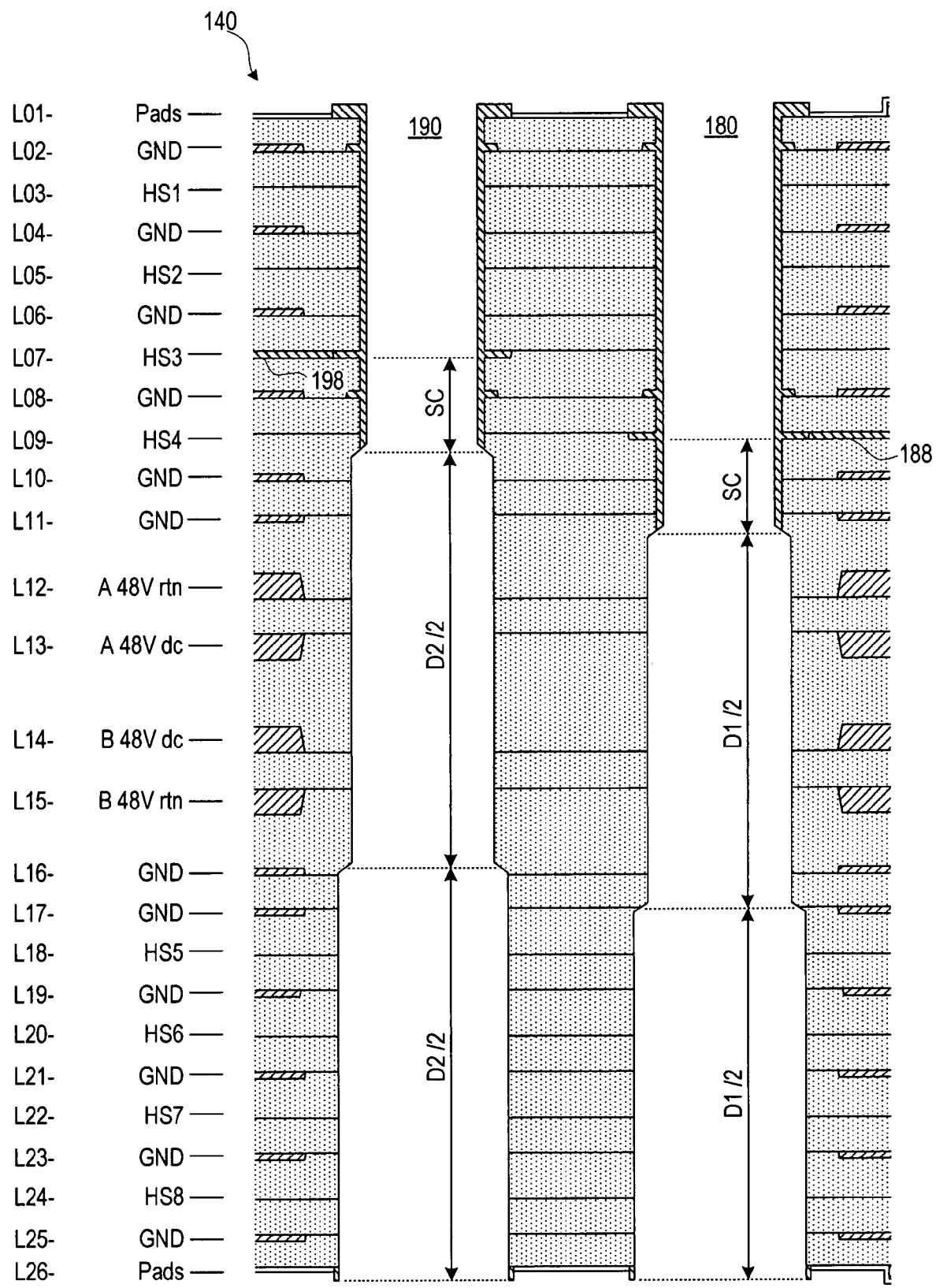

FIGS. 6A and 6B illustrate a potential crosstalk configuration, with two neighboring thru-holes 180 and 190 used for connections to two separate signal traces (not part of the same differential pair), 188 and 198, respectively. Signal trace 188 is located on signal layer HS4, and signal trace 198 is located on signal layer HS3. In FIG. 6B, thru-hole 180 has been back-drilled to a depth D1 and thru-hole 190 has been back-drilled to a depth D2, with D1 and D2 based respectively on the positions of trace layers HS4 and HS3. Each back-drill is followed by a second back-drill cycle of larger diameter, to half of the original depth. Because resonances within each thru-hole are diminished, crosstalk between the neighboring thru-holes is reduced as well.

Figure 7A:
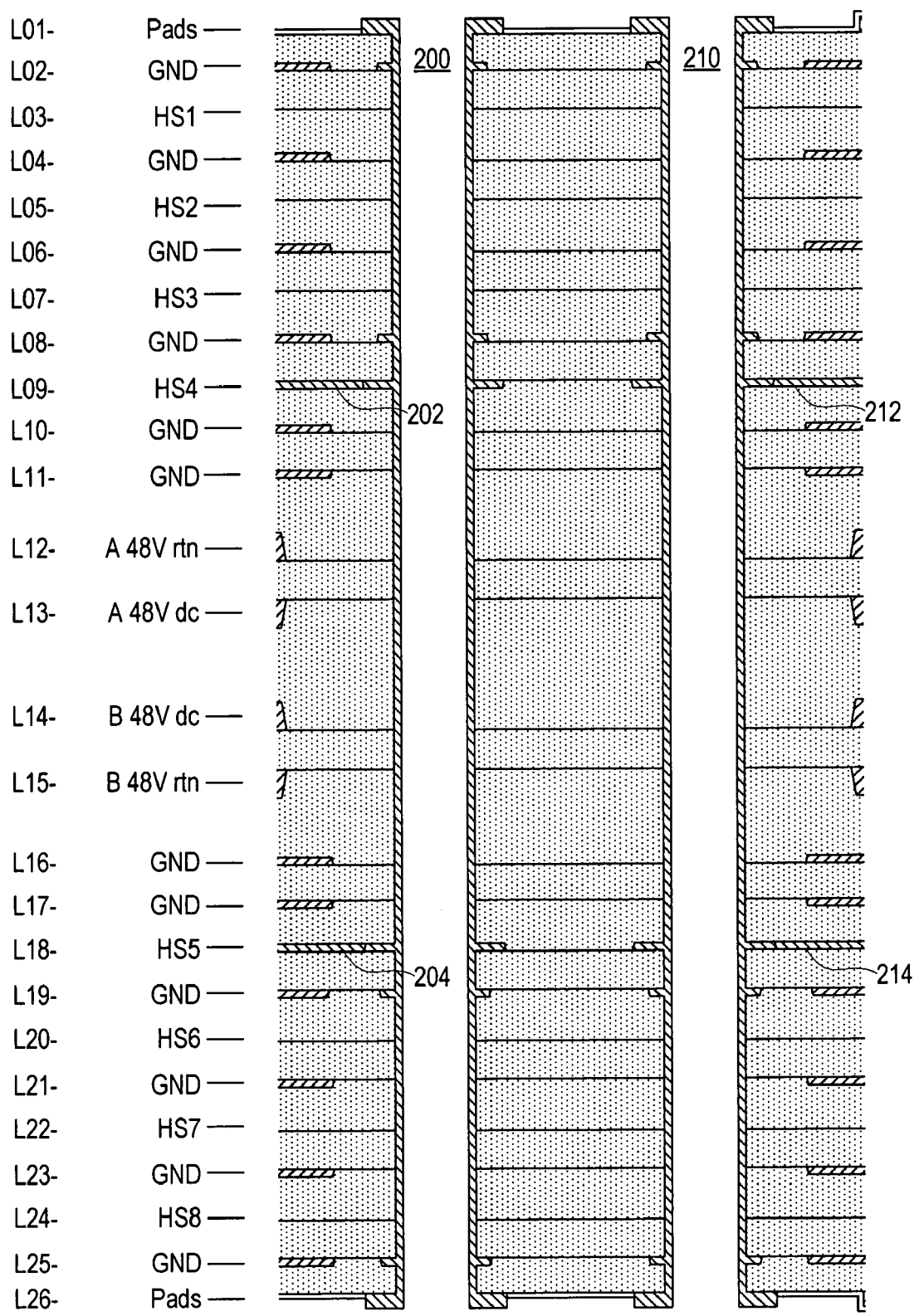
FIGS. 7A and 7B illustrate steps in the fabrication of neighboring layer-swapping vias for a differential pair according to an embodiment.
Figure 7B:
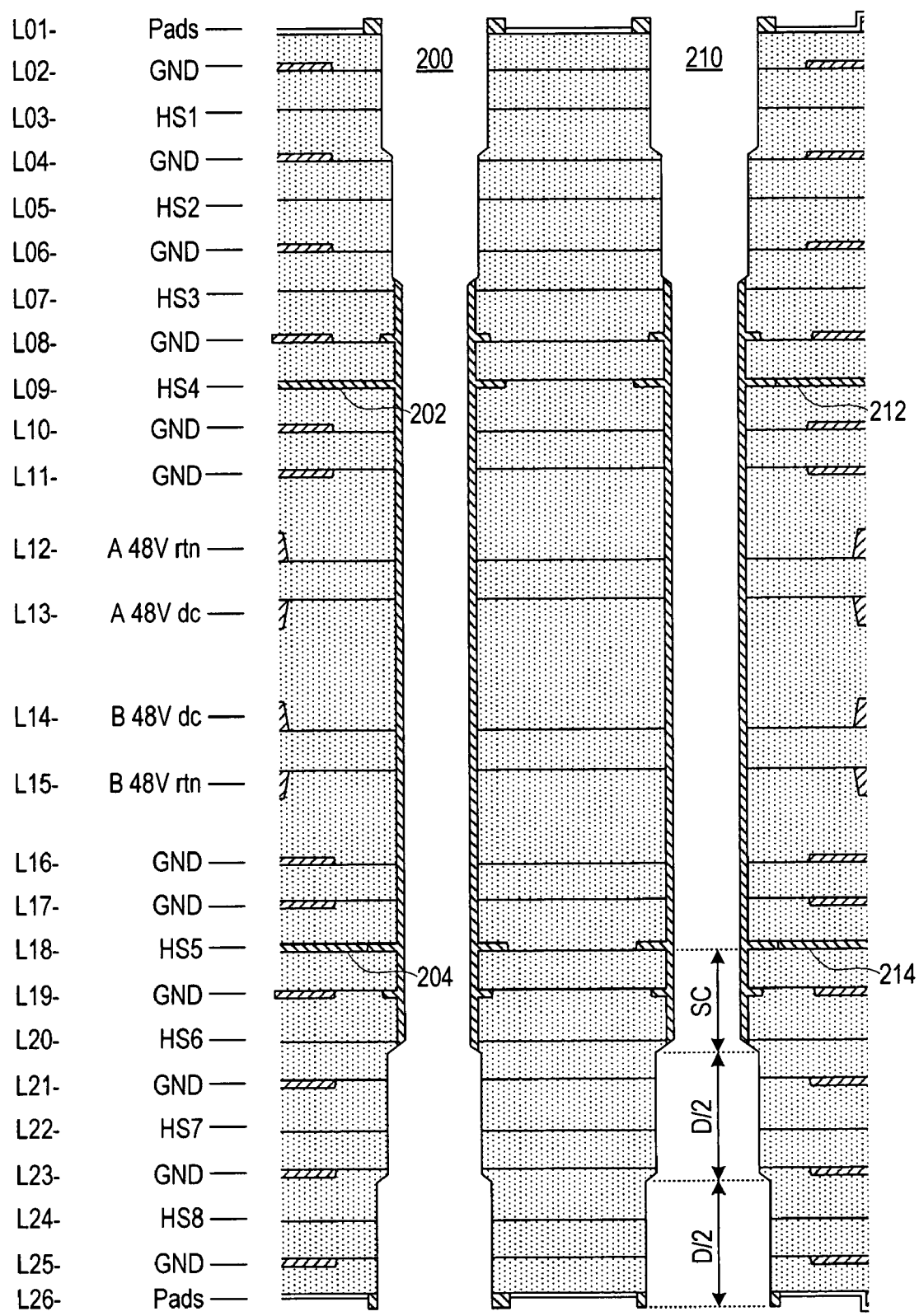

FIGS. 7A and 7B illustrate a pair of vias 200 and 210 used to transfer a differential signal from a pair of differential traces on one high-speed trace layer to a pair of differential traces on another high-speed trace layer. Not all differential pairs on the backplane will use a layer-swapping via pair, but the selective use of this feature simplifies trace routing and allows the use of fewer routing layers. In FIG. 7A, via pair 200, 210 electrically connects to a layer HS4 differential trace pair 202, 212, respectively, and a layer HS5 differential trace pair 204, 214, respectively. As opposed to thru-holes, vias do not require external connection and are typically smaller in diameter. In one embodiment, vias 200 and 210 have a 16 mil diameter.

In FIG. 7B, vias 200 and 210 have been identically back-drilled and top-drilled, using a two-step drill cycle for each via. A first drill cycle uses a diameter of 20 to 21 mils to a depth D, and a second drill cycle uses a diameter of 24 to 26 mils to a depth D/2. In this example, D is 50 to 60 mils, corresponding to a half-wavelength at frequencies between 15 and 20 GHz. Depending on whether frequencies at this range are of concern, a designer could choose to single-drill these vias, or to perform no drill and rely on the nonfunctional pads on ground layers L02, L08, L19, and L25 to reduce stub reflections.

FIG. 8 illustrates a backplane cross-section 220, taken along a single signal path from an exemplary thru-hole 230, through a trace 235 to a via 240 connected to that thru-hole, and through a trace 245 to another thru-hole 250. A connector 260 couples thru-hole 230 to an external component (not shown) mated to connector 260, and a connector 270 couples thru-hole 250 to an external component (not shown) mated to connector 270. The external components could be, for instance, Z-PACK™ HS3 connector sockets that mate with Z-PACK™ HS3 connector blocks on line cards or switch fabric cards. Only the end sections of traces 235 and 245 are shown such that the thru-hole and via detail can be made visible. Typically, a parallel set of thru-holes, traces, and a via will follow a similar course to form a differential pair.

In FIG. 8, trace 235 runs on layer HS5 and trace 270 runs on layer HS4. Accordingly, thru-holes 230 and 250 are double-back-drilled to respective depths D1 and D2 as described in the embodiments above, and via 240 is double-back-drilled and double-top-drilled to a depth D1 as described in the embodiments above. Depending on the frequencies of interest, a designer could alternately choose to single-drill thru-hole 230 and via 240 due to the short distances, or to not drill the stubs in 230 and 240 and rely on the nonfunctional pads to reduce stub reflections.

Figure 9:
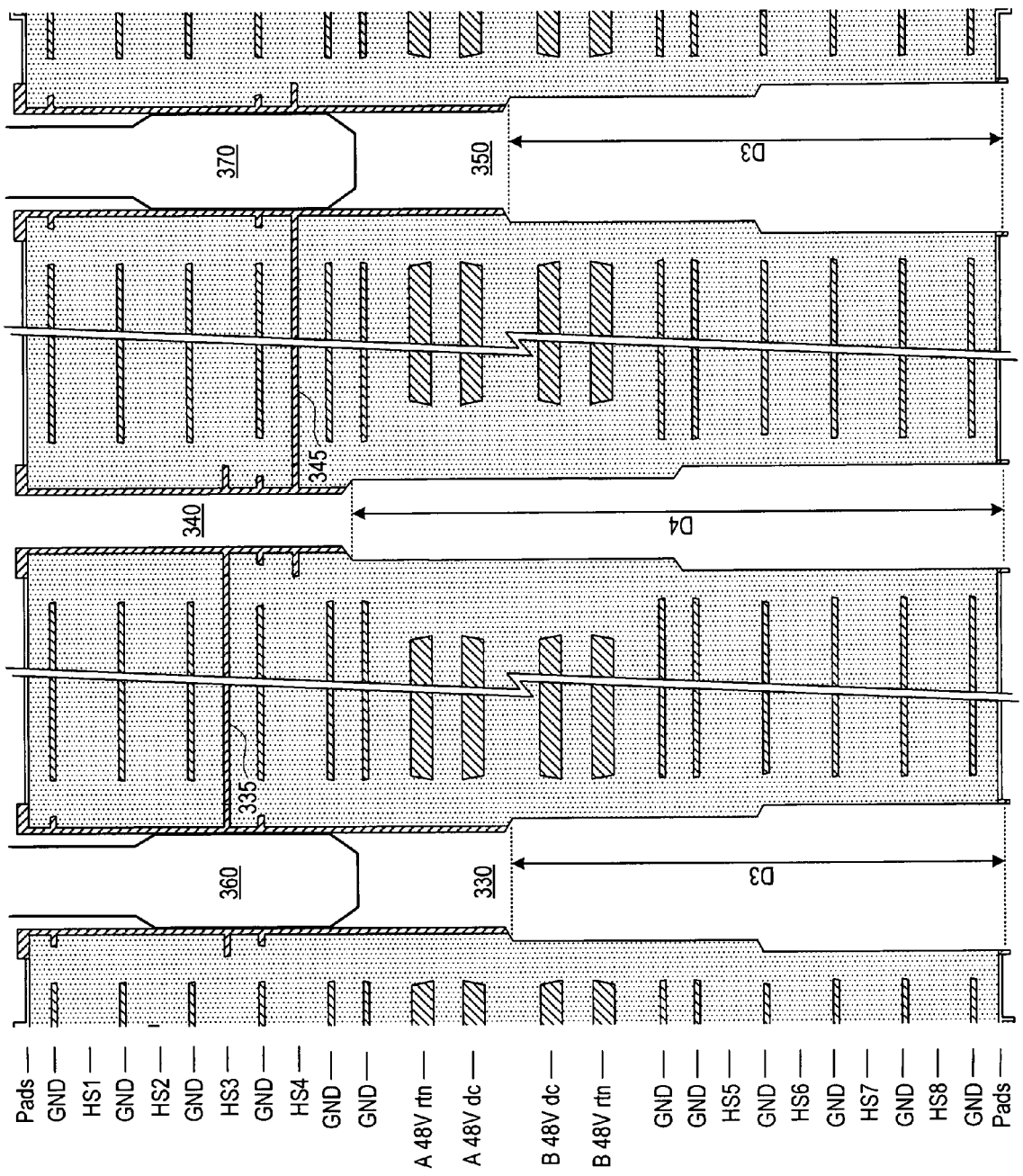

FIG. 9 contains a similar cross-section configuration as FIG. 8, forming a signal path between a connector 360, a thru-hole 330, a trace 335, a via 340, a trace 345, a thru-hole 350, and a connector 370. In this example, trace 335 runs on layer HS3 and trace 345 runs on layer HS4. Thru-holes 330 and 350 are both back-drilled to a depth D3, approximately halfway through the board, and then back-drilled to a depth of D3/2 to a larger diameter. Via 340 is back-drilled to a depth of D4, stopping between GND layers L10 and L11, and then back-drilled to a depth of D4/2 to a larger diameter. Via 340 is not top-drilled, but relies on non-functional pads to control stub reflections on its top end. Although it would be possible to drill the thru-holes deeper and to different depths, selecting a common depth simplifies the drill process, and it is believed that selecting a different depth for the thru-holes and the intermediate via improves the channel frequency response.

Figure 10:
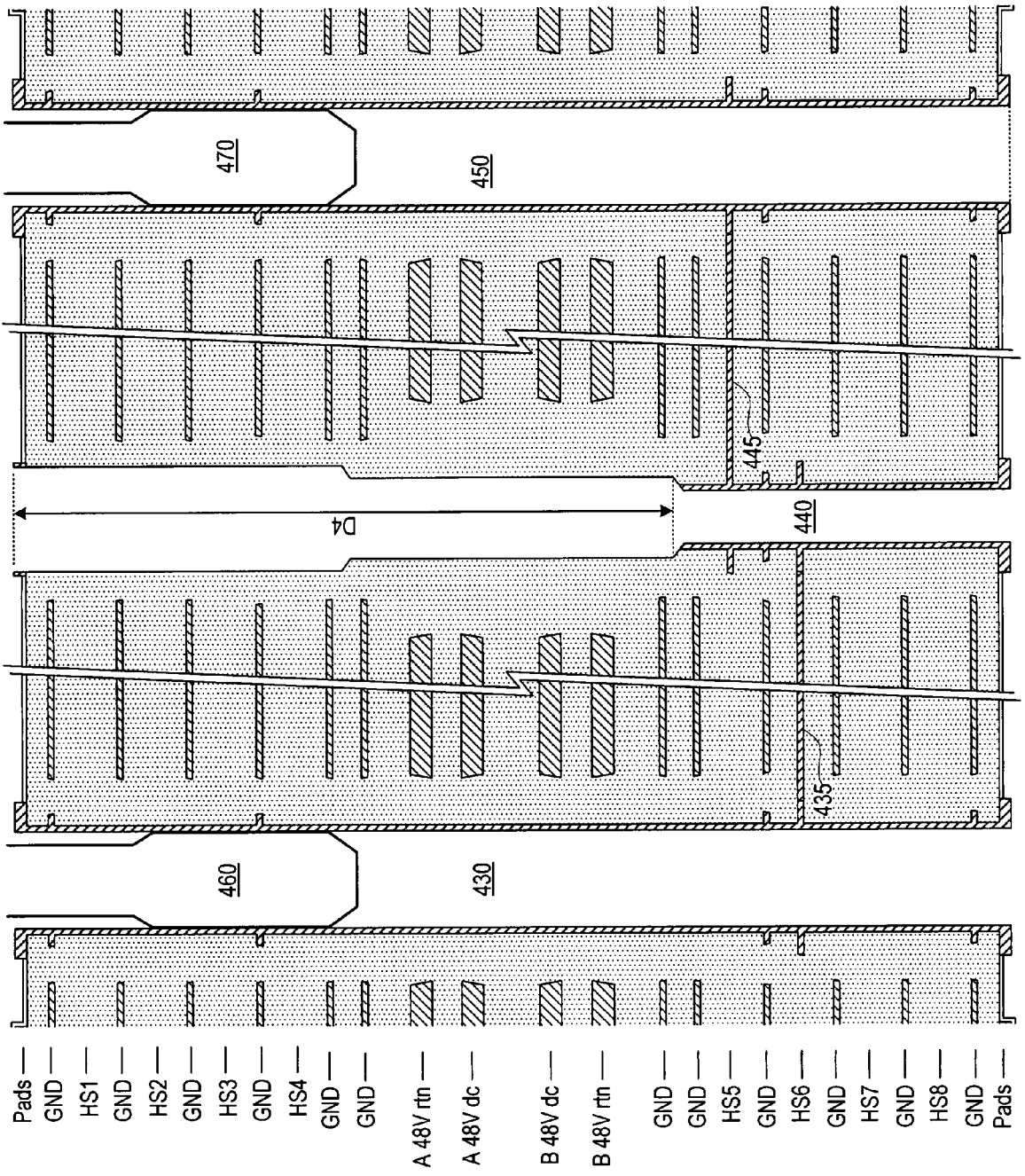

FIG. 10 contains a similar cross-section configuration as FIG. 9, forming a signal path between a connector 460, a thru-hole 430, a trace 435, a via 440, a trace 445, a thru-hole 450, and a connector 470. In this example, trace 435 runs on layer HS6 and trace 445 runs on layer HS5. Thru-holes 430 and 450 are not back-drilled, but rely on non-functional pads to control stub reflections. Via 440 is top-drilled to a depth of D4, stopping between GND layers L16 and L17, and then top-drilled to a depth of D4/2 to a larger diameter. Via 440 is not back-drilled, but relies on non-functional pads to control stub reflections on its bottom end.

Differential Pair Routing

High-speed signaling across the backplane preferably utilizes differential trace pairs. One aspect of the disclosure therefore involves the routing layout of differential trace pairs within the high-speed signaling layers and thru vias such as vias 340 and 440.

Figure 11:
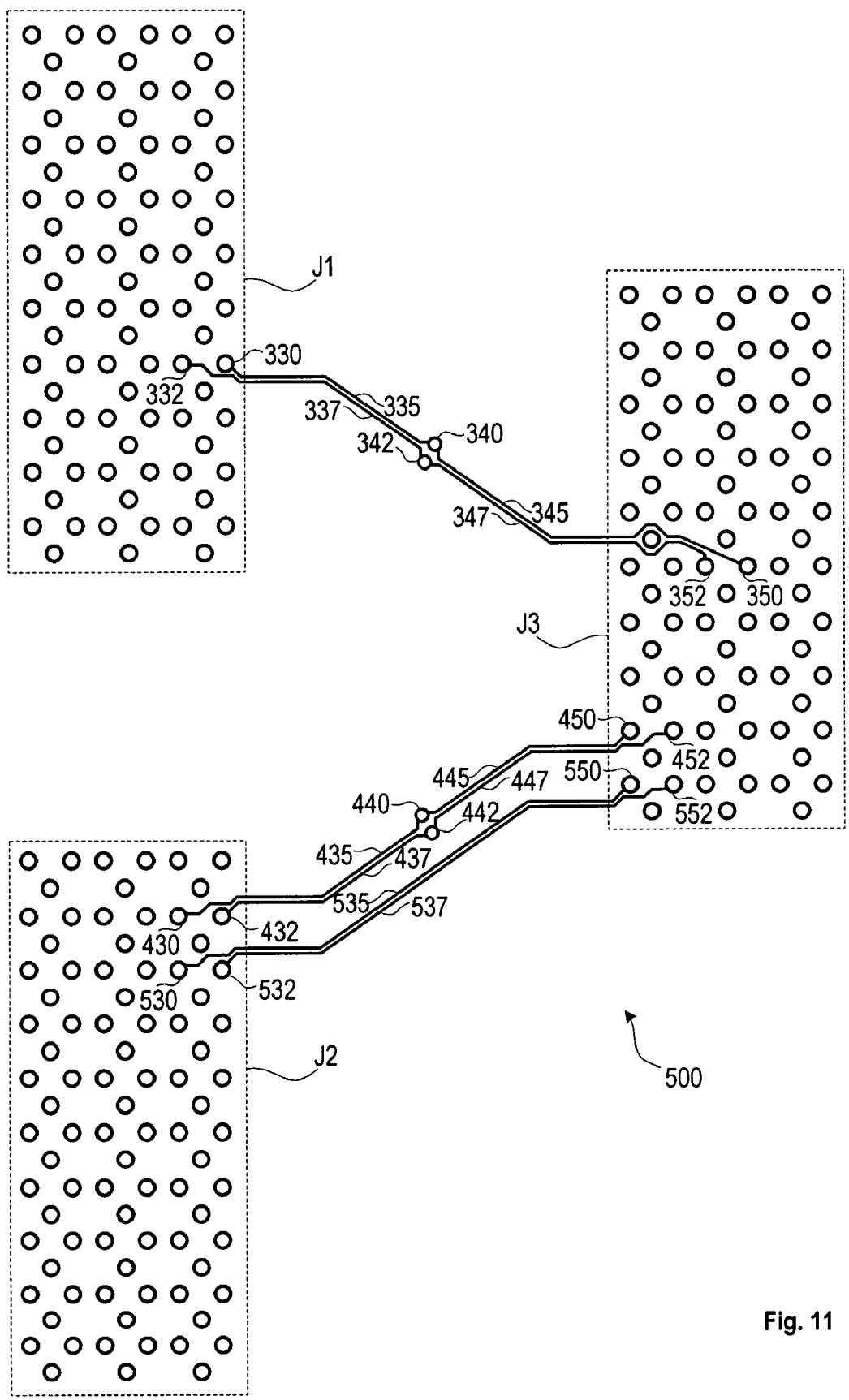
FIG. 11 illustrates several exemplary trace routing embodiments applicable to cross-sections disclosed above.

FIG. 11 shows a plan view of an exemplary partial routing layout 500 for three differential pairs between three connector block regions J1, J2, and J3. This partial layout does not necessarily correspond to any particular connections between the connector block regions shown in FIG. 3, and differential pair routing will typically involve longer distances than those shown in an actual embodiment.

The cross-sectional signal routing of FIG. 9 is shown in plan view in FIG. 11, connecting block regions J1 and J3 as part of a differential pair. Thru-hole 330 and an identical thru-hole 332 in connector block region J1 provide connection points for one end of a differential signal, and couple respectively to a differential trace pair 335, 337 on layer HS3. Differential trace pair 335, 337 terminates at via 340 and an identical via 342, which transfers the differential signal to another differential trace pair 345, 347 on layer HS4. Differential trace pair 345, 347 terminates at thru-hole 350 and an identical thru-hole 352 in connector block region J3. Thru-holes 330, 332, 350, and 352 have the thru-hole profile shown in FIG. 9. Vias 340 and 342 have the via profile shown in FIG. 9.

The cross-sectional signal routing of FIG. 10 is also shown in plan view in FIG. 11, connecting block regions J2 and J3 as part of a differential pair. Thru-hole 430 and an identical thru-hole 432 in connector block region J2 provide connection points for one end of a differential signal, and couple respectively to a differential trace pair 435, 437 on layer HS6. Differential trace pair 435, 437 terminates at via 440 and an identical via 442, which transfers the differential signal to another differential trace pair 445, 447 on layer HS5. Differential trace pair 445, 447 terminates at thru-hole 450 and an identical thru-hole 452 in connector block region J3. Thru-holes 430, 432, 450, and 452 have the thru-hole profile shown in FIG. 10. Vias 440 and 442 have the via profile shown in FIG. 10.

Many of the differential pairs will not use an intermediate layer-swapping via pair, such as the differential pair 535, 537 shown in FIG. 11. Differential pair 535, 537 connects a thru-hole pair 530, 532 in connector block region J2 to a thru-hole pair 550, 552 in connector block region J3. If the differential pair 535, 537 is routed on a layer on the upper half of the board (HS1, HS2, HS3, or HS4), the thru-hole profile shown in FIG. 9 is selected for all four thru-holes. If the differential pair 535, 537 is routed on a layer on the lower half of the board (HS5, HS6, HS7, or HS8), the thru-hole profile shown in FIG. 10 is selected for all four thru-holes.

Using the principles shown and described in conjunction with FIGS. 9-11, a board can be designed using only two different signaling thru-hole profiles (not accounting for the position of the signal pad as "different") and two different via profiles (again not accounting for the position of the signal pads as "different"). With vias constrained to layer swap either between two layers in the upper half of the board or between two layers in the lower half of the board, a two-step back-drill or a two-step top-drill is selected for each via. Signaling thru-holes with signal pads on the upper half of the board are identically back-drilled; signaling thru-holes with signal pads on the lower half of the board are not. Nonfunctional pads on selected digital ground plane layers are used to control stub reflections where back-drill and/or top-drill are not selected. Using this design, the back-drill tool can form all holes of a common size using a common drill depth.

One of ordinary skill in the art will recognize that the concepts taught herein can be tailored to a particular application in many other advantageous ways. The back-drill profile can use more than two hole profiles, and/or can include a smoothly varying profile in a section of the hole. A specialized bit with a dual diameter and preset step depth can be used to drill both back-drill hole profiles with a single drill cycle. The larger diameter, shallower depth hole can be drilled prior to the smaller diameter, deeper section of the hole. Neither hole profile need necessarily be round, with round selected merely for ease of fabrication. Other tools and techniques can be used to form other hole profiles.

Although a backplane embodiment has been disclosed, the concepts taught herein apply equally to other interconnection arrangements such as midplanes.

Although the specification may refer to "an", "one", "another", or "some" embodiment(s) in several locations, this does not necessarily mean that each such reference is to the same embodiment(s), or that the feature only applies to a single embodiment.

What is claimed is:

1. A circuit board comprising:
   a plurality of conductive layers separated by insulating layers, at least some of the conductive layers patterned to contain traces; and
   a first hole through the circuit board and having a conductive liner in a first longitudinal segment of the hole, the conductive liner electrically connected to a first one of the traces on at least a first one of the conductive layers, the hole having a second longitudinal segment with no conductive liner, adjacent to a first end of the hole, the second longitudinal segment of the hole comprising at least one transition from a first profile adjacent the first end of the hole to a second profile longitudinally separated from the first end of the hole; wherein the first and second longitudinal segments are or equal or unequal length.

2. The circuit board of claim 1, wherein the first hole is a thru-hole providing an electrical connection to a first component mated to the circuit board.

3. The circuit board of claim 2, wherein the first component is mated to the circuit board on a side opposite the first end of the thru-hole.

4. The circuit board of claim 1, wherein the hole is a via providing an electrical connection between the first one of the traces and a second one of the traces located on a second one of the conductive layers.

5. The circuit board of claim 4, the via having a third longitudinal segment with no conductive liner, adjacent to a second end of the hole, the third longitudinal segment comprising at least one transition from a third profile adjacent the second end of the hole to a fourth profile longitudinally separated from the second end of the hole.

6. The circuit board of claim 5, wherein the first and third profiles are substantially equivalent and the second and fourth profiles are substantially equivalent.

7. The circuit board of claim 1, wherein a length of the second longitudinal segment is substantially equal to a longitudinal depth of the first one of the conductive layers from the first end of the hole, minus a stop clearance.

8. The circuit board of claim 1, wherein the first and second profiles are substantially round, the first profile having a diameter at least ten percent greater than the second profile.

9. The circuit board of claim 1, wherein the transition between the first and second profiles occurs approximately midway along the length of the second longitudinal segment.

10. The circuit board of claim 1, wherein a length of a section of the second longitudinal segment having the second profile is related to a primary radio frequency energy component to be suppressed, with the length of the section being substantially different from any integer number of half-wavelengths of the primary radio frequency.

11. The circuit board of claim 1, wherein a length of a section of the second longitudinal segment having the first profile is related to a primary radio frequency energy component to be suppressed, with the length of the section is substantially different from any integer number of half-wavelengths of the primary radio frequency.

12. The circuit board of claim 1, wherein a length of a section of the second longitudinal segment having the second profile is related to a primary radio frequency energy component to be suppressed, with the length of the section being substantially equal to a quarter-wavelength of the primary radio frequency.

13. The circuit board of claim 1, wherein the first hole is a thru-hole providing an electrical connection to a first component mated to the circuit board, the circuit board further comprising a second thru-hole providing an electrical connection to a second component mated to the circuit board, the second thru-hole having a conductive liner in a first longitudinal segment of the second hole and electrically connected to one of the traces on one of the conductive layers, the second thru-hole having a second longitudinal segment with no conductive liner, adjacent to a first end of the second hole, the second longitudinal segment of the second hole comprising at least one transition from the first profile adjacent the first end of the second hole to the second profile longitudinally separated from the first end of the second hole.

14. The circuit board of claim 13, wherein the first and second thru-holes are substantially similar and connected to opposite ends of the first one of the traces.

15. The circuit board of claim 13, wherein the trace connected to the second thru-hole is a second trace on a second one of the conductive layers.

16. The circuit board of claim 15, wherein a length of a second longitudinal segment of the first thru-hole is substantially equal to the longitudinal depth of the first one of the conductive layers from the first end of the first hole minus a stop clearance, and a length of a second longitudinal segment of the second thru-hole is substantially equal to the longitudinal depth of the second one of the conductive layers from the first end of the second hole minus the stop clearance.

17. The circuit board of claim 16, wherein for the second longitudinal segments of the first and second holes, the lengths of the segments having the second hole profile are each substantially equal to half the respective lengths of the second longitudinal segments.

18. The circuit board of claim 16, wherein for the second longitudinal segments of the first and second holes, a length of a section of the second longitudinal segments of the first and second holes having the second profile are substantially equal.

19. The circuit board of claim 15, further comprising a via providing an electrical connection between the first one of the traces and the second one of the traces.

20. The circuit board of claim 19, the via having a conductive liner in a first longitudinal segment of the via and electrically connected to the first and second traces, the via having a second longitudinal segment with no conductive liner, adjacent to a first end of the via, the second longitudinal segment of the via comprising at least one transition from a third profile adjacent the first end of the via to a fourth profile longitudinally separated from the first end of the via.

21. The circuit board of claim 20, the via having a third longitudinal segment with no conductive liner, adjacent to the second end of the via, the third longitudinal segment comprising at least one transition from the third profile adjacent the second end of the hole to the fourth profile longitudinally separated from the second end of the hole.

22. The circuit board of claim 20, the conductive liner in the first longitudinal segment of the via passing through a non-functional conductive pad on at least one of the conductive layers.

23. A circuit board comprising:
   a plurality of conductive trace layers and a plurality of conductive ground plane layers separated by insulating layers, the conductive trace layers arranged such that they are each positioned between a pair of ground plane layers, the conductive trace layers each comprising a plurality of differential signaling trace pairs; and
   a plurality of hole pairs positioned at the termination points of the differential trace pairs, at least a first subset of the holes having a partial conductive liner electrically contacting the differential trace pair termination point associated with those holes, the holes in the first subset each comprising an end section with no conductive liner, the end section comprising at least one transition from a first profile to a second profile, wherein the hole pairs included in the first subset consist of hole pairs that are substantially identical to each other.

24. The circuit board of claim 23, wherein the first subset of the holes comprises signaling thru-holes mated to components on a top side of the circuit board and coupled to conductive trace layers positioned in the top half of the circuit board.

25. The circuit board of claim 24, at least a second subset of the holes comprising signaling thru-holes mated to components on a top side of the circuit board and coupled to conductive trace layers positioned in the bottom half of the circuit board, the second subset of the holes having a complete conductive liner.

26. The circuit board of claim 25, the second subset of the holes passing through and electrically connected to nonfunctional conductive pads on selected ones of the conductive ground plane layers.

27. The circuit board of claim 23, wherein a second subset of the first subset of the holes comprises via pairs, each via in each such pair having a partial conductive liner electrically contacting two differential trace pair termination points on two different conductive trace layers.

28. The circuit board of claim 27, wherein when the two different conductive trace layers exist in the top half of the circuit board, the end section of the via with no conductive liner is formed in the bottom end of the circuit board, and when the two different conductive trace layers exist in the bottom half of the circuit board, the end section of the via with no conductive liner is formed in the top end of the circuit board.

29. The circuit board of claim 27, wherein the via pairs have an end section with no conductive liner that is of a different length than the end section of the other holes in the first subset.

30. The circuit board of claim 23, wherein the transition from the first profile to a second profile occurs approximately midway along the end section in each hole of the first subset.

31. A router comprising the circuit board of claim 23.

* * * * *